United States Patent [19]

Horne et al.

[11] Patent Number: 5,293,116
[45] Date of Patent: Mar. 8, 1994

[54] METHOD AND APPARATUS FOR MEASURING NONLINEARITY IN THIN FILM HEADS DURING THEIR FABRICATION

[76] Inventors: Donald E. Horne, 963 Summerleaf Dr.; Prakash Kasiraj, 1343 Via De Los Reyes; Fior D. Sargent, 6143 Oak Forest Way, both of San Jose, Calif. 95120

[21] Appl. No.: 882,246

[22] Filed: May 8, 1992

Related U.S. Application Data

[63] Continuation of Ser. No. 708,486, May 31, 1991, abandoned.

[51] Int. Cl.$^5$ .................. G01R 33/12; G11B 3/90; G11B 27/36; G11C 7/06
[52] U.S. Cl. .................. 324/212; 365/201; 369/55
[58] Field of Search ........... 324/210, 211, 212, 232, 324/262; 369/55; 365/171, 172, 173, 201; 29/603

[56] References Cited

U.S. PATENT DOCUMENTS

| | | | |
|---|---|---|---|
| 3,710,235 | 1/1973 | Barrager et al. | 324/210 |
| 3,787,964 | 1/1974 | Simon et al. | 29/603 |
| 4,280,158 | 7/1981 | De Niet | 360/113 |
| 4,343,026 | 8/1982 | Griffith et al. | 360/113 |
| 4,574,234 | 3/1986 | Inbar | 324/73 |
| 4,660,025 | 4/1987 | Humphrey | 340/572 |
| 4,900,650 | 2/1990 | Das | 430/319 |
| 4,907,114 | 3/1990 | Shiki et al. | 360/113 |
| 4,912,584 | 3/1990 | Mallary et al. | 360/126 |
| 4,931,730 | 6/1990 | Olsen et al. | 324/209 |
| 4,956,736 | 9/1990 | Smith | 360/113 |

*Primary Examiner*—Walter E. Snow

[57] ABSTRACT

At the wafer level, a conventional write signal is applied to a pre-selected thin film head. Thereafter, first and second constant amplitude, differing frequency sine wave signals are applied to the head along with a DC bias signal whose magnitude is varied. The level of frequency mixing in the output signal of the head is detected at each level of magnitude of the DC bias signal and this data is utilized in predicting the level of noise in the read-back signal of the thin film head during normal read and write operations in connection with a rotating storage disk.

23 Claims, 3 Drawing Sheets

METHOD AND APPARATUS FOR MEASURING NONLINEARITY IN THIN FILM HEADS DURING THEIR FABRICATION

This is a continuation of application Ser. No. 07/708,486 filed May 31, 1991, now abandoned.

The present invention relates to recording heads, and more particularly, to the fabrication of thin film heads used in Winchester disk drives.

Thin film heads have been developed for high-precision multi-track digital data recording, particularly in connection with rotating rigid disk media. They may be either inductive or magnetoresistive. Batch fabrication techniques may be utilized in the manufacture of thin film heads. They capitalize on semiconductor-like processing technology in which the core, the surrounding coils and the coil connectors are deposited by evaporation, sputtering or plating.

Increased recording densities on rigid disks are being achieved by continually reducing the track width. The corresponding reduction required in the width of inductive thin film heads has led them to exhibit a noise phenomenon in which the amplitude as well as the timing window of the read-back signal varies after writing with the thin film head. These distortions and fluctuations are caused by flux conduction which results from domain wall switching. This nonlinearity leads to poor recording performance, i.e. read-back errors.

Conventionally, the only reliable way to detect read-back noise in an inductive thin film head has been to fly the head over a storage disk and to make actual recording performance measurements. This type of test, which is referred to as a MAG test, must be accomplished when the fabrication of the thin film head is completed. Previous attempts to detect read-back noise in an inductive thin film head without flying the head have met with limited success due to lack of noise detection sensitivity. In one attempt, the variation in inductance of a completed inductive thin film head after passing a write current through the head has been used as a measure of noise resulting from domain wall switching. However, this approach lacks sufficient sensitivity to replace or complement the standard magnetic recording test for head noise.

Thin film heads are simultaneously fabricated in large batches on a single wafer substrate. For example, one thousand thin film heads may be fabricated on a single wafer. Early detection of distortion in thin film heads during their fabrication could reduce manufacturing costs and provide diagnostic information useful in improving the fabrication process.

SUMMARY OF THE INVENTION

It is therefore the primary object of the present invention to provide a method and apparatus for measuring nonlinearity in the performance of thin film heads during their fabrication.

Another object of the present invention is to provide a method and apparatus which provide greater sensitivity in detecting domain wall switching in inductive thin film recording heads.

Another object of the present invention is to provide a method and apparatus which permit the detection of the expected level of noise in the read-back signals of inductive thin film heads at the wafer level.

Another object of the present invention is to provide a method and apparatus which permit inexpensive testing of thin film heads in high volume production environments.

Our invention measures variations in the nonlinearity of a thin film head as it is magnetized by a slowly varying field. These variations may be exhibited by frequency, harmonic or phase distortions. A preferred embodiment of our apparatus includes a wafer prober machine for supporting a wafer having a plurality of inductive thin film heads formed thereon. The apparatus further includes a pair of sine wave signal generators and a DC sweep circuit connected to the wafer prober. Output signals from the coil of the contacted head are fed to a filter and receiver circuit and then to a controller for statistical analysis. The preferred embodiment of our apparatus may further include a write signal generator which may pre-apply a conventional write signal to the inductive thin film head in order to bias the domain walls prior to stimulating the coil with DC and oscillating signals.

According to the preferred embodiment of our method, a standard write signal is applied to the coil of a selected inductive thin film head on a wafer during a first time interval. During a second time interval, first and second constant amplitude differing frequency sine wave signals are applied to the coil while at the same time a DC bias signal is stepped through a plurality of magnitudes. The level of frequency mixing in the coil is detected at each magnitude of the DC bias signal. The difference of the minimum and maximum levels of detected frequency mixing is compared to a predetermined threshold value to determine acceptability of the head. The variation in the detected amount of frequency mixing reliably predicts the amount of noise to be expected in the read-back signal of the inductive thin film head during the normal read and write operations in conjunction with a rotating storage disk.

DESCRIPTION OF THE PREFERRED EMBODIMENTS

The preferred embodiments of our invention are based on the recognition that domain wall switching in an inductive thin film head can be detected by the nonlinear behavior of the head as it is magnetized from zero field conditions. The variations in the nonlinearity of the inductive thin film head as it is magnetized by a slowly varying field provide a sensitive and quantitative electrical signature of domain wall switching in the head.

Figure 1:
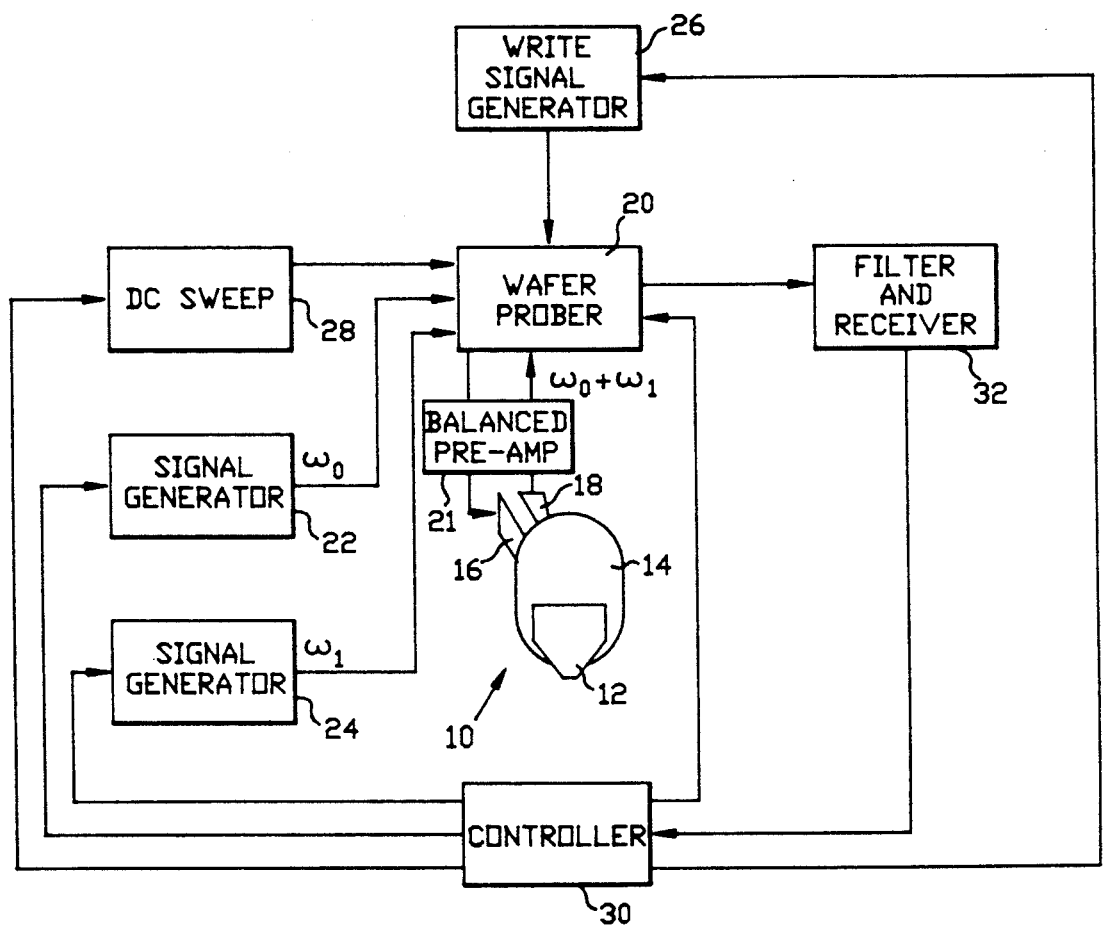
FIG. 1 is a block diagram of a preferred embodiment of an apparatus for detecting nonlinearity in the performance of an inductive thin film head.

FIG. 1 illustrates a block diagram of an apparatus for detecting domain wall switching in an inductive thin film head. The thin film head 10 includes a Ni—Fe core 12, a spiral coil 14 and coil connectors 16 and 18. In the practice of our invention, the thin film head 10 is one of a plurality of heads, for example, one thousand heads, being simultaneously fabricated on the same wafer (not illustrated) according to well known manufacturing methods.

Signals are applied to the connector 16 (FIG. 1) of the thin film head 10 through a wafer prober machine 20. An output signal on the connector 18 of the head is received by the wafer prober machine 20. Such machines are widely used in semi-conductor fabrication. They physically support the wafer and enable electrical contact to be selectively established with the connectors and pads of the individual devices that have been fabricated on the wafer. Electrical signals ar applied to and received from these connectors and pads through a balanced pre-amp circuit 21 which is physically positioned very close to the wafer. The actual electrical connection with the wafer is established with the utilization of minute probes which can be mechanically moved to different connectors and pads on command. One suitable wafer prober machine is the model 2001X commercially available from Electroglass, Inc. of Santa Clara, Calif., U.S.A.

Referring still to FIG. 1, the preferred embodiment of our apparatus further comprises a first signal generator 22 and a second signal generator 24. The first signal generator 22 is used to apply a first oscillating signal $w_0$ to the connector 16 of the coil 14. The second signal generator is used to apply a second oscillating signal $w_1$ to the connector 16. The first oscillating signal $w_0$ and the second oscillating signal $w_1$ have constant amplitudes but different frequencies. In the preferred embodiment of our apparatus, $w_0$ has a frequency of 10.45 Mhz and $w_1$ has a frequency of 0.25 Mhz. Also, in the preferred embodiment of our apparatus both $w_0$ and $w_1$ are sine waves. The signal generators 22 and 24 may be any conventional signal generators that will produce constant amplitude sine wave signals at these frequencies.

A write signal generator 26 (FIG. 1) is provided for applying binary signals to the coil 14 of the thin film head. These write signals correspond in level and timing to those which will be applied to the head 10 during normal read and write operations once the head has been assembled into a Winchester disk drive. Circuits which can generate such write signals are well known by those skilled in the design of Winchester disk drives and need not be further described herein.

The preferred embodiment of our measuring apparatus further includes a DC sweep circuit 28 (FIG. 1) which can apply direct current (DC) signals of varying magnitudes to the coil 14 of the thin film head on command. The balanced pre-amp circuit 21 matches the impedance of the combination of the DC and oscillating signals to the impedance of the coil 14. The nonlinearity of the head 10 as it is magnetized by slowly varying fields provides a very sensitive and quantitative electrical signature of domain wall switching in the head. The DC sweep circuit 28 (Fig. 1) initially provides a bias current of minus one milliamp. On command of a controller 30 the DC sweep circuit steps the DC signal up one-tenth of a milliamp at a time until a bias current of plus one milliamp is reached. During this time, the controller 30 causes the signal generators 22 and 24 to generate and apply the oscillating signals $w_0$ and $w_1$.

Before the DC sweep circuit 28 and the signal generators 22 and 24 are made to apply their signals to the head, the controller 30 causes the write signal generator 26 to apply a predetermined write signal to the head. Thereafter, the controller 30 causes the DC sweep circuit 28 and the signal generators 22 and 24 to apply their signals. Periodically thereafter, the controller 30 disables the application of the DC bias signals and the sine wave signals $w_0$ and $w_1$ so that the write signal can be re-applied.

The output signal of the coil 14, namely, $w_0+w_1$, is amplified by the balanced pre-amp circuit 21 and fed through the wafer prober 20 to a filter and receiver circuit 32. This circuit detects the level of mixing of the oscillating signals $w_0$ and $w_1$ in the head for different DC biases. These levels are conveyed to controller 30 for statistical analysis. The level of frequency mixing represents the distortion or nonlinearity of the head which is representative of a level of expected noise in the read-back signal of the head during normal read and write operations in connection with a rotating storage disk.

In the preferred embodiment of our measuring apparatus the filter and receiver circuit 32 includes a crystal lattice filter with very high selectivity. Either the sum or the difference in the frequencies of $w_0$ and $w_1$ can be detected by the filter and receiver circuit 32. One suitable crystal lattice filter for detecting the sum of these frequencies, namely, 10.7 Mhz, is the Model Comline 1469 commercially available from Piezio Technology, Inc. of Orlando, Fla., U.S.A.

Referring still to FIG. 1, the controller 30 comprises a personal computer along with a suitable interface circuit. The interface circuit includes digital-to-analog circuits for enabling the personal computer to control the DC sweep circuit 28 and the sine wave generators 22 and 24. The interface circuit further includes an analog-to-digital circuit for permitting the personal computer to receive and process digital data representative of the level of the 10.7 Mhz signal detected by the filter and receiver circuit 32. The interface circuit also includes digital-to-analog circuits for permitting the personal computer to control the write signal generator 26. The interface circuit further includes a bus for permitting the personal computer to control the wafer prober machine 20. One suitable personal computer is the PS/2 (Trademark), Model 30 commercially available from International Business Machines Corporation of Armonk, N.Y., U.S.A. In an actual implementation of the invention, we used an older IBM AT (Trademark) personal computer. One suitable interface circuit is the Model 2821 interface card commercially available from Data Translation of Marlboro, Mass., U.S.A.

The preferred embodiment of our method can now be described in detail. A wafer (not illustrated) having a plurality of inductive thin film heads fabricated thereon is loaded into the wafer prober 20. This can be done as soon as the fabrication process has proceeded far enough so that the core 12 and coil 14 are formed, and prior to subsequent fabrication steps.

Figure 2:
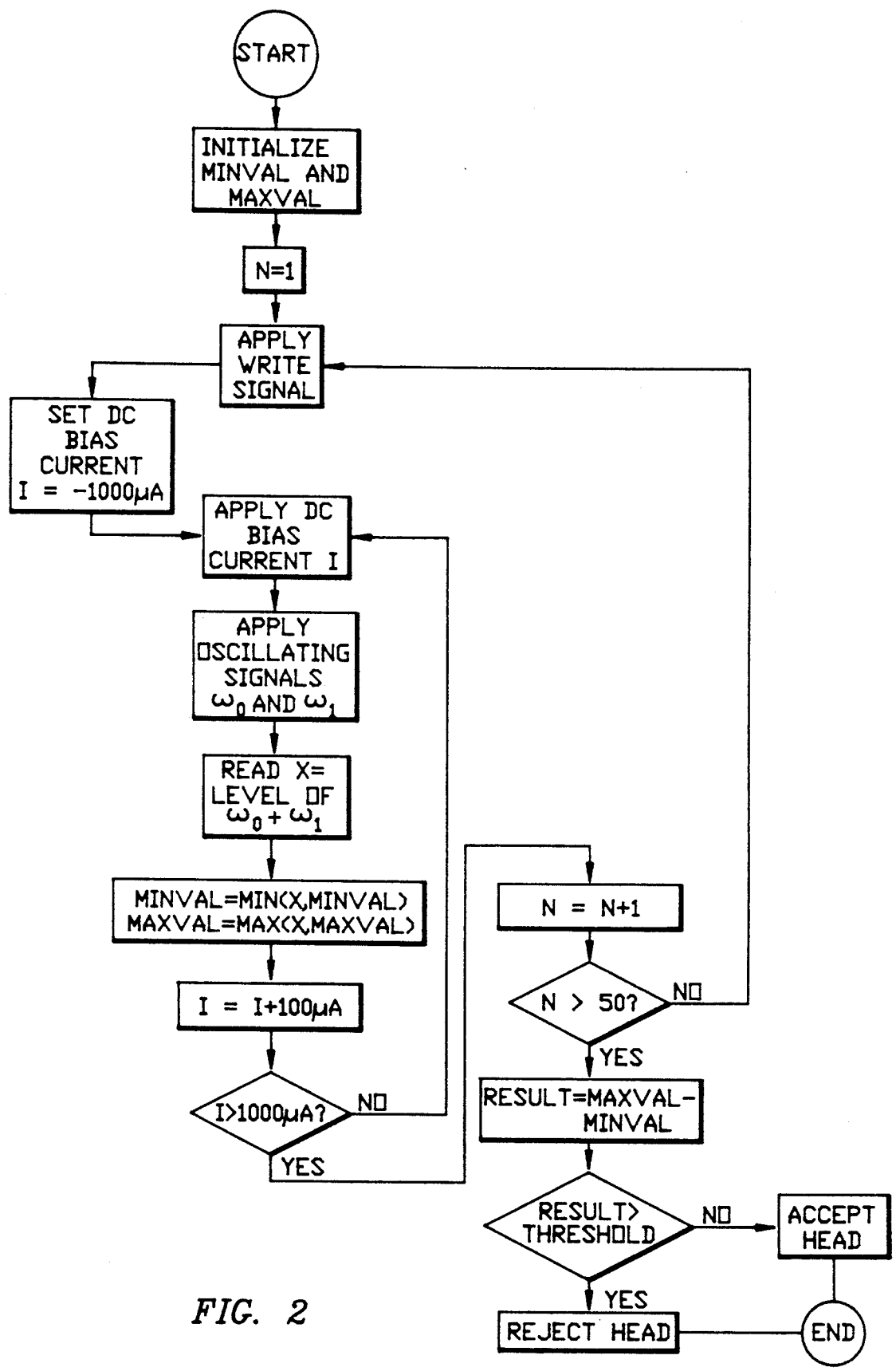
FIG. 2 is a flow diagram illustrating a program that may be executed by the apparatus of FIG. 1 in carrying out a preferred embodiment of our method.

FIG. 2 is a flow diagram of a computer program that may be executed by the personal computer of the controller 30 in performing the preferred embodiment of our method utilizing the apparatus illustrated in FIG. 1. The steps illustrated in FIG. 2 are preferably performed for each inductive thin film head fabricated on the same wafer. The personal computer first commands the wafer prober 20 to place its probes in contact with connectors 16 and 18 of the selected head to be tested. Thereafter, the personal computer initializes two variables, namely, MINVAL and MAXVAL. MINVAL can be set to the maximum integer value to be expected during the test, such as 2000 microvolts. Similarly, MAXVAL can be set to the minimum integer value to be expected during the test, namely, zero. Another variable N is set to equal "one" as this value will be used to count the number of loops through a major phase of the program.

The personal computer next commands the write signal generator 26 to apply a predetermined write signal to the head. In our preferred embodiment, this signal is sent at 8 Mhz for two microseconds at 30 milliamps. The application of the write signal forces the magnetic domains in the Ni—Fe core 12 of the head to align themselves in one direction.

Upon termination of the write signal, the personal computer commands the DC sweep circuit 28 to set a DC bias current (labeled I) at minus 1000 microamperes. The personal computer then causes the DC sweep circuit to apply the DC bias current I. During the same interval that the DC bias current is being applied, the personal computer commands the signal generators 22 and 24 to apply the oscillating signals $w_0$ and $w_1$ which, as previously mentioned, are sine wave signals at 10.45 Mhz and at 0.25 Mhz respectively.

During the interval that the DC bias current and the oscillating signals are applied, the amplitude of the oscillating signals is held constant. Variations in the nonlinearity of the head as it is magnetized by the slowly varying field provided by the DC bias current yield a very sensitive and quantitative electrical signature of domain wall switching in the head.

The level X of the mixing of the oscillating signals $w_0$ and $w_1$ is read by the personal computer through the filter and receiver circuit 32 during the interval of simultaneous application of the DC bias current and the oscillating signals. MINVAL is then reset as the minimum of X and the prior setting of MINVAL. MAXVAL is then reset as the maximum value of X and the prior setting of MAXVAL.

The personal computer then commands the DC sweep circuit 28 to step up the bias current I by 100 microamperes. If the bias current does not yet exceed 1000 microamperes, the personal computer then causes the new bias current I to be applied to the head. The oscillating signals $w_0$ and $w_1$ are re-applied and MINVAL and MAXVAL are reset in accordance with the procedure already explained.

Once the bias current I exceeds 1000 microamperes, the personal computer increments the variable N by one. If the value of N does not exceed fifty, then the personal computer loops back and causes the write signal to be applied, the DC bias current to be set to minus 1000 microamperes and so forth.

It can be seen that MINVAL and MAXVAL are determined through fifty loops as the DC bias current is stepped from minus 1000 microamperes to positive 1000 microamperes. Upon completion of the fifty loops, the personal computer sets a variable RESULT which is equal to the difference between MAXVAL and MINVAL. If the result is greater than a predetermined threshold value, then the head is rejected and this is logged by the personal computer. If the result is not greater than a predetermined threshold value, then the head is accepted and this is logged by the personal computer. At the end of the program, the personal computer causes the wafer prober 20 to apply its probes to the next inductive thin film head on the wafer. It is tested using the method of FIG. 2. Each head on the wafer is sequentially tested thereafter.

In the preferred embodiment of our invention described above, the bias current is stepped twenty-one times during each loop and there are fifty loops. The looping adds a degree of reliability to our method since the nonlinearity in the head yields different frequency mixing levels for a given DC bias signal over successive loops. Thus, according to the method illustrated in the flow diagram of FIG. 2, there are 1,050 frequency mixing levels detected. Various statistical tests can be applied to this data in determining whether to accept or reject the head. The preferred embodiment of our invention utilizes the range of this data, represented by MINVAL and MAXVAL. Alternatively, the mean or the standard deviation of these numbers may be utilized. The standard deviation may be a superior predictor of head noise in some circumstances.

It is not necessary to test every head on a wafer. Nor is it necessary to test every wafer during assembly line production. Instead, statistical sampling methods well known in the field of quality control may be utilized.

Figure 3:
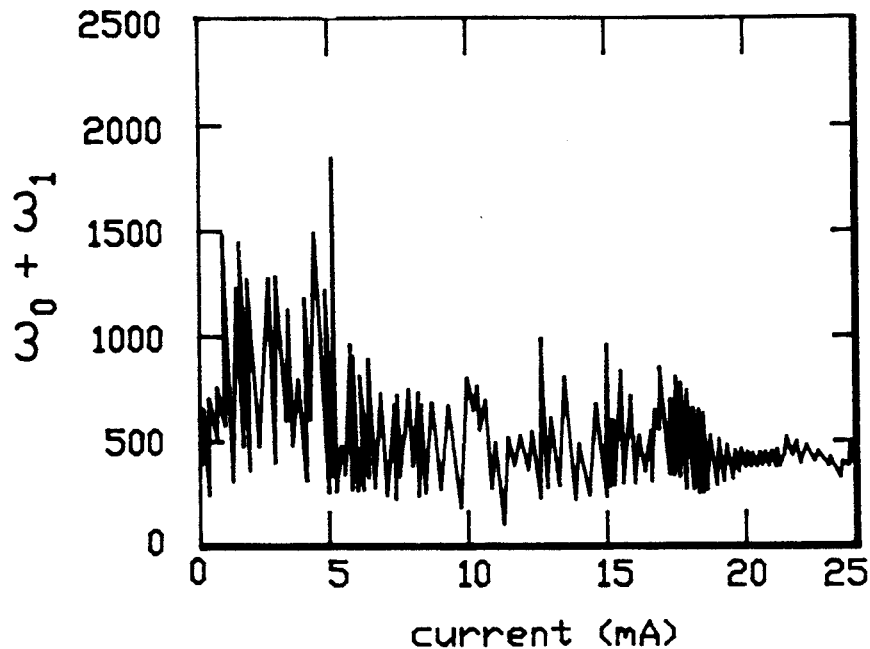
FIG. 3 is a graph illustrating the level of frequency mixing in an inductive thin film head over a wide range of DC bias current in accordance with our invention.

FIG. 3 is a graph depicting the level of mixing or frequency distortion over a wide range of DC bias signals. The portion of the curve between 20 and 25 milliamps depicts minimal distortion. This shape of the curve is indicative of a minimum level of expected noise in an inductive thin film head at this DC bias level. In the preferred embodiment of our invention, we sweep the DC bias signal from minus 1000 microamperes to plus 1000 microamperes. We have found that this particular range provides a good indication of expected noise in an inductive thin film head during normal read and write operations in conjunction with a rotating storage disk.

Figure 4:
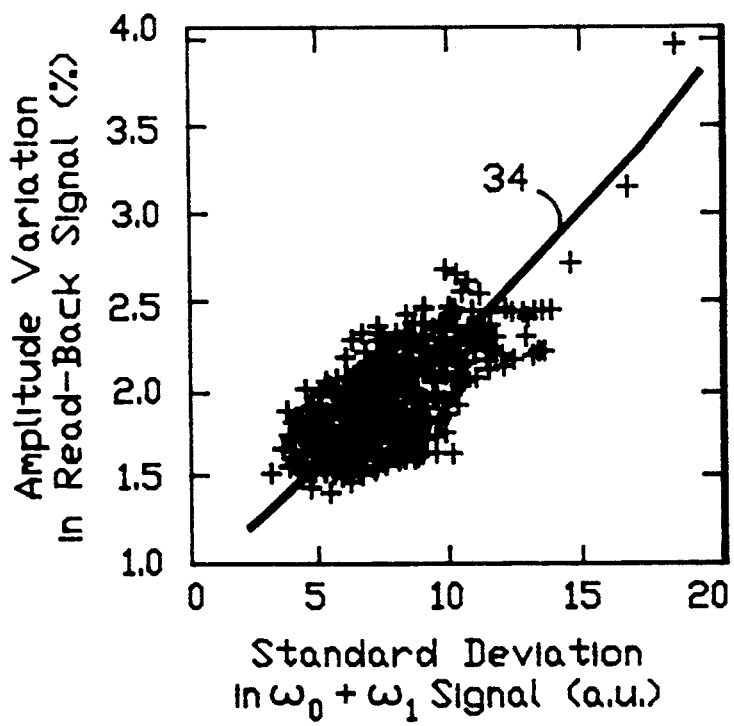
FIG. 4 a graph illustrating the level of distortion according to the prior art MAG test compared with the standard deviation of a set of data representing levels of frequency mixing measured in accordance with our invention.

FIG. 4 illustrates in graphic form how the results of our approach compare favorably to the results of a MAG test. The results of tests on many heads on the same wafer are set forth in the graph of FIG. 4. The vertical axis of the graph represents amplitude variations in the read-back signal in percentage units according to a MAG test. The horizontal axis of the graph represents the standard deviation of the mixing signal data for a given head. Thus, each cross plotted in the graph of FIG. 4 represents the MAG test percentage for a particular head and the standard deviation of the frequency mixing data for that same head. The crosses in FIG. 4 have merged into a blur in certain portions of the graph. Line 34 represents a correlation of the data points represented by the crosses. The tight spread or bunching of the crosses in FIG. 4 indicates that our method is an accurate predictor of the expected noise in the read-back head of an inductive thin film head.

Thus, we have discovered that by slowly varying the magnetic field in an inductive thin film head while applying a substantially constant amplitude oscillating signal, at the wafer level of fabrication, distortions in the output signal from the coil can accurately predict the quantity of distortion in the read-back signal of the head when used in normal read and write operations in connection with a rotating storage disk. While we have described preferred embodiments of our method and apparatus for measuring read-back noise in inductive thin film heads, it should be understood that modifications and adaptations thereof will occur to persons skilled in the art. For example, it may be possible to eliminate the write signal and still obtain a reliable prediction of head performance. Also, a lone oscillating signal could be utilized in which case harmonic or phase distortion in the output signal of the head could be detected. Where harmonic or phase distortion are detected instead of frequency distortion, other detection schemes must be utilized in place of the filter and receiver circuit 32 of the preferred embodiment of our method and apparatus. Furthermore, a wide range of statistical analysis could be performed on the measurements taken in connection with the thin film head at the wafer level. Our invention can be used to test completed heads as well as those still at the wafer stage. In addition, it may be possible to utilize our invention with magnetoresistive, ferrite and MIG heads used in disk and tape drives. Therefore, the protection afforded our invention should only be limited in accordance with the scope of the following claims.

We claim:

1. A method of measuring variations in the nonlinearity of a recording head representative of the expected noise in the read-back signal of the head during normal read and write operations comprising the steps of:
applying an oscillating signal to a coil of head;
applying a DC signal to the coil along with the oscillating signal;
varying the magnitude of the DC signal while maintaining an amplitude of the oscillating signal substantially constant; and
detecting a level of distortion in an output signal of the coil representative of a level of expected noise in the read-back signal of the head during normal read and write operations.

2. A method according to claim 1 wherein the magnitude of the DC signal is swept through a plurality of different levels and the level of distortion is detected at each level of magnitude of the DC signal.

3. A method according to claim 2 wherein the level of distortion is detected N times for each level of magnitude of the DC signal.

4. A method according to claim 3 and further comprising the step of applying a write signal to the coil before applying the oscillating signal and the DC signal.

5. A method according to claim 1 and further comprising the step of applying a second oscillating signal to the coil along with the DC signal.

6. A method according to claim 5 wherein the oscillating signals have different frequencies and the level of distortion is detected by sensing a level of frequency mixing in the output signal.

7. A method according to claim 5 wherein the level of frequency mixing is determined by filtering the output signal to remove all but a component thereof having a frequency selected from the group consisting of the sum of the frequencies of the two oscillating signals and the difference of the frequencies of the two oscillating signals.

8. A method according to claim 6 wherein the magnitude of the DC signal is swept through a plurality of different magnitudes and a level of frequency mixing is detected at each level of magnitude of the DC signal.

9. A method according to claim 8 and further comprising the step of comparing the difference of a minimum value and a maximum value of the detected levels of frequency mixing to a predetermined threshold value to determine whether the head has an acceptable level of performance to make it suitable for use.

10. A method according to claim 1 wherein the head is an inductive thin film head and the oscillating signal and the DC signal are applied to the coil while the inductive thin film head is formed on a wafer having a plurality of inductive thin film heads formed thereon.

11. A method of measuring variations in the nonlinearity of an inductive thin film head representative of the expected noise in the read-back signal of the head during normal read and write operations in connection with a rotating storage disk, comprising the steps of:
applying first and second substantially constant amplitude oscillating signals having different frequencies to a coil of an inductive thin film head;
applying a DC bias signal to the coil along with the oscillating signals;
varying the magnitude of the DC bias signal; and
detecting a level of frequency mixing in an output signal of the coil representative of a level of expected noise in the read-back signal of the head during normal read and write operations in connection with a rotating storage disk.

12. A method according to claim 11 wherein the magnitude of the DC bias signal is swept through a plurality of different levels and the level of frequency mixing is detected at each level of magnitude of the DC bias signal.

13. A method according to claim 12 wherein the level of frequency mixing is detected N times for each level of magnitude of the DC bias signal.

14. A method according to claim 13 and further comprising the step of applying a write signal to the coil before applying the oscillating signals and the DC bias signal.

15. A method according to claim 11 wherein the level of frequency mixing is determined by filtering the output signal to remove all but a component thereof having a frequency equal to the sum of the frequencies of the first and second oscillating signals.

16. A method according to claim 11 wherein the level of frequency mixing is determined by filtering the output signal to remove all but a component thereof having a frequency equal to the difference in the frequencies of the first and second oscillating signals.

17. A method according to claim 13 wherein a maximum value of the level of frequency mixing and a minimum value of the level of frequency mixing are determined, and the acceptability of the head is determined by comparing the difference between the maximum value and the minimum value to a predetermined threshold value.

18. A method according to claim 11 wherein the oscillating signals and the DC bias signal are applied to the coil while the head if formed on a wafer having a plurality of inductive thin film heads formed thereon.

19. A method of measuring the variations of nonlinearity of an inductive thin film head representative of the expected noise in the read-back signal of the head during normal read and write operations in connection with a rotating storage disk, comprising the steps of:
positioning a wafer having a plurality of inductive thin film heads formed thereon in a wafer prober machine;
causing a set of probes of the wafer prober machine to contact a pair of coil connectors of a selected head on the wafer;
applying a write signal to a first one of the coil connectors of the head for a first predetermined interval;
during a second predetermined interval simultaneously applying to the first coil connector first and second constant amplitude sine wave signals at 10.45 Mhz and 0.25 Mhz, respectively, along with a DC bias signal;

during the second interval, increasing the DC bias signal from minus 1000 microamperes to plus 1000 microamperes in 100 microamper steps;

at each step of DC bias signal, filtering an output signal on a second one of the coil connectors to remove all but a 10.7 Mhz component thereof;

determining a minimum value of the 10.7 Mhz component and a maximum value of the 10.7 Mhz component; and comparing a difference in the minimum and maximum values of a 10.7 Mhz component to a predetermined threshold value and rejecting the head if the difference exceeds the threshold value.

20. An apparatus for measuring variations in the non-linearity of a thin film head representative of the expected noise in the read-back signal of the head during normal read and write operations in connection with a rotating storage disk, comprising:

means for supporting a wafer having formed thereon a plurality of thin film heads and for selectively contacting the coil connectors of a selected head on the wafer;

signal generator means connected to the wafer supporting and contacting means for applying an oscillating signal to a coil of the selected head;

sweep circuit means connected to the wafer supporting and connecting means for applying a variable magnitude DC signal to the coil of the selected head along with the oscillating signal; and means connected to the wafer supporting and contacting means for detecting a level of distortion in an output signal of the coil representative of a level of expected noise in the read-back signal of the head during normal read and write operations in connection with a rotating storage disk.

21. An apparatus according to claim 20 and further comprising:

second signal generator means connected to the wafer supporting and contacting means for applying a second oscillating signal to the coil of the selected head.

22. An apparatus according to claim 20 and further comprising a write signal generator connected to the wafer supporting and contacting means for applying a write signal to the coil of the selected head.

23. An apparatus according to claim 20 and further comprising controller means connected to the detector means for analyzing an output signal of the detector means and determining whether or not the selected head exhibits a level of distortion which exceeds a determined threshold.

* * * * *

UNITED STATES PATENT AND TRADEMARK OFFICE
CERTIFICATE OF CORRECTION

PATENT NO. : 5,293,116
DATED : March 8, 1994
INVENTOR(S) : Horne, et. al.

It is certified that error appears in the above-indentified patent and that said Letters Patent is hereby corrected as shown below:

Title page, item [73], Assignee: insert-- INTERNATIONAL BUSINESS MACHINES CORPORATION, Armonk N.Y.

Title page, col. 2, item [56], after Primary Examiner - Walter E. Snow, insert --Attorney, Agent, or Firm - Baker, Maxham, Jester & Meador--

Signed and Sealed this

Nineteenth Day of July, 1994

Attest:

BRUCE LEHMAN

*Attesting Officer*     *Commissioner of Patents and Trademarks*